United States Patent [19]
Bishop et al.

[11] Patent Number: 5,335,133
[45] Date of Patent: Aug. 2, 1994

[54] DUAL OUTPUT BATTERY WITH FAULT DETECT

[75] Inventors: Michael R. Bishop; David H. Minasi, both of Plantation, Fla.

[73] Assignee: Motorola, Inc., Schaumburg, Ill.

[21] Appl. No.: 799,811

[22] Filed: Nov. 29, 1991

[51] Int. Cl.$^5$ ............................................. H02H 3/28
[52] U.S. Cl. ...................................... 361/56; 361/86; 307/28
[58] Field of Search ............... 361/86, 87, 18, 58, 361/56, 57; 307/28, 58

[56] References Cited

U.S. PATENT DOCUMENTS

| | | |
|---|---|---|
| 3,686,530 | 8/1972 | Bogut . |
| 4,447,841 | 5/1984 | Kent ............................. 361/18 |
| 5,179,493 | 1/1993 | Imanishi ......................... 361/91 |
| 5,195,011 | 3/1993 | Giorgetta et al. ............... 361/87 |

Primary Examiner—Todd Deboer
Attorney, Agent, or Firm—Pedro P. Hernandez

[57] ABSTRACT

Battery (300) includes a first redundant limiting circuit (302) for limiting the voltage and current levels which are outputted by the first limited battery output (308). A second redundant limiting circuit (304) provides for a second limited battery output (310). Connected to both the first (308) and second (310) battery outputs is a fault monitoring circuit (306), which monitors for any faults such as electrical shorts, occurring at any of the two battery outputs (308 or 310). The fault monitoring circuit (306) interrupts the appropriate output, if a fault, or a current limiting condition occurs. Battery (300) allows for radios which would otherwise not be able to achieve intrinsic safe level approvals to attain such approvals.

5 Claims, 2 Drawing Sheets

DUAL OUTPUT BATTERY WITH FAULT DETECT

TECHNICAL FIELD

This invention relates generally to batteries, and more specifically to a portable battery for use with a communication device.

BACKGROUND

The high circuit densities encountered in modern radios make it difficult for radio manufacturers to meet the spacing specifications (intrinsic safety spacing requirements) laid down by intrinsic safety testing agencies (e.g., Underwriters' Laboratories (UL)-United States, Factory Mutual (FM)- United States, BASEE-FA- United Kingdom Testing Agency, CENTALEC- Federal Republic of Germany, etc.)for achieving intrinsic safety approval ratings. Both component-to-component and layer-to-layer spacing distances, have to be well above the specified minimum spacing distances, (typically have to be greater than 0.5 millimeter) in order to meet the spacing constraints placed on radio manufacturers by intrinsic safety testing agencies.

The spacing requirements imposed by the testing agencies (in order to meet intrinsic safety approvals) are seldom achieved by radio manufacturers, due to the great amount of integration modern radios are required to have in order to achieve their small size and at the same time still retain all of their numerous user features. Not meeting the minimum spacing requirements causes the testing agencies to consider the whole radio as a "mass fault." This allows the testing agency to sum all capacitances and/or inductances and place them as if they are connected to the test point (node) they are testing in the radio. They can also assume the worst case voltage and current levels, and also assume the greatest power output capable of being achieved by the radio, when running any approval tests. This in turn forces the radio manufacturers to limit current and voltage levels in the radio to levels considered safe enough to meet intrinsic safety requirements by intrinsic safety testing agencies.

Typical maximum values imposed by the agencies, once a radio is considered a mass fault, are in the order of a maximum operating voltage of six volts and no more than a maximum of 250 milliamps current output at the battery. For more stringent approval ratings, not more than 50 milliamps of current can be sourced by the battery. The main problem with limiting a radio to these low current and voltage values, is that these values limit the total amount of power output the radio would be capable of delivering. These very restrictive value settings would not allow high powered radios to meet intrinsic safety levels.

In FIG. 1, there is shown a block diagram of a prior art portable radio with battery 100. Battery 102 consists of a plurality of rechargeable nickel-cadmium battery cells connected in series, forming a rechargeable battery pack 108. Coupled to the positive terminal 114 of battery pack 108, are a redundant set of current and voltage limiter circuits 104. The output 112 of the voltage/current limiter circuits, provides a regulated output for portable radio 106. A second output 110 is provided by battery 102, which provides the ground potential connection to radio 106. The major problem with the prior art radio and battery 100 shown in FIG. 1, is that radio 106 would still be limited to the low voltage and current levels (e.g., 6 volts, 250 milliamps) required by the testing agency in the case the spacing requirements in the radio 106 are not being meet.

A need thus exists in the art for a way of achieving higher levels of intrinsic safety standards in portable electronic devices without having to meet the spacing limitations placed on the devices by the testing agencies, or without having to limit the amount of voltage and current capable of being supplied by the battery to the device in order to meet the requirement.

SUMMARY OF THE INVENTION

Briefly according to the invention, a battery monitors whether a fault condition has occurred and automatically interrupts the outputs to the radio. Thus, isolation or spacing requirements within the radio would not have to be met in order to achieve intrinsic safety approval requirements.

The battery comprises a battery housing and a battery pack located inside of the battery housing. The battery further includes first and second limiting means coupled to the battery pack for providing first and second limited battery outputs, respectively. Finally, the battery includes a fault detection means coupled to the first and second limited battery outputs for interrupting at least one of the first and second limited battery outputs in the event a fault condition occurs at any of the two limited battery outputs.

Detailed Description of the Preferred Embodiment

Figure 1:
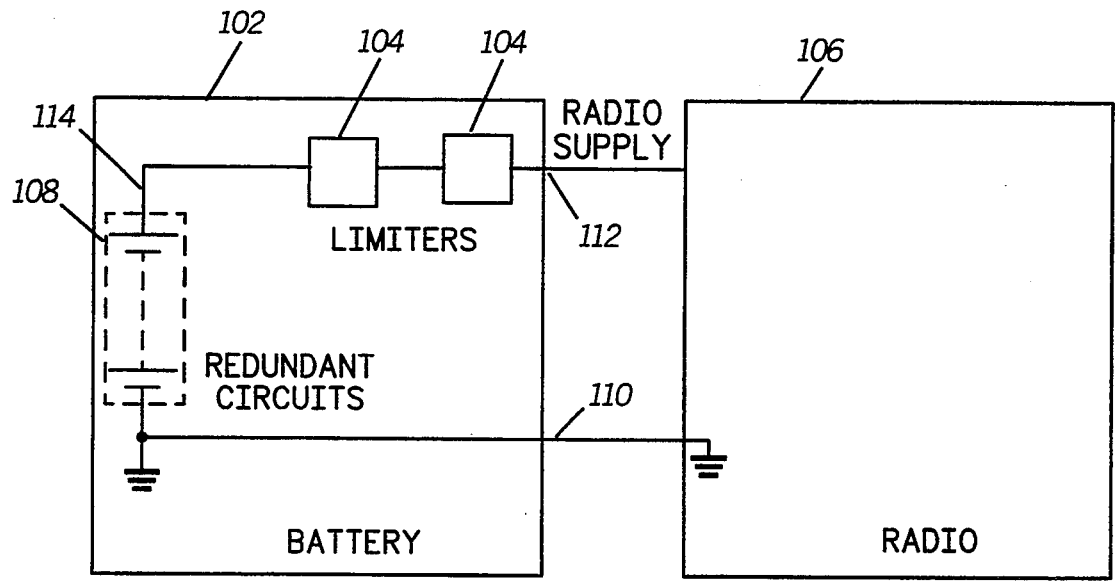
FIG. 1 is a block diagram of a prior art battery and radio.
Figure 2:
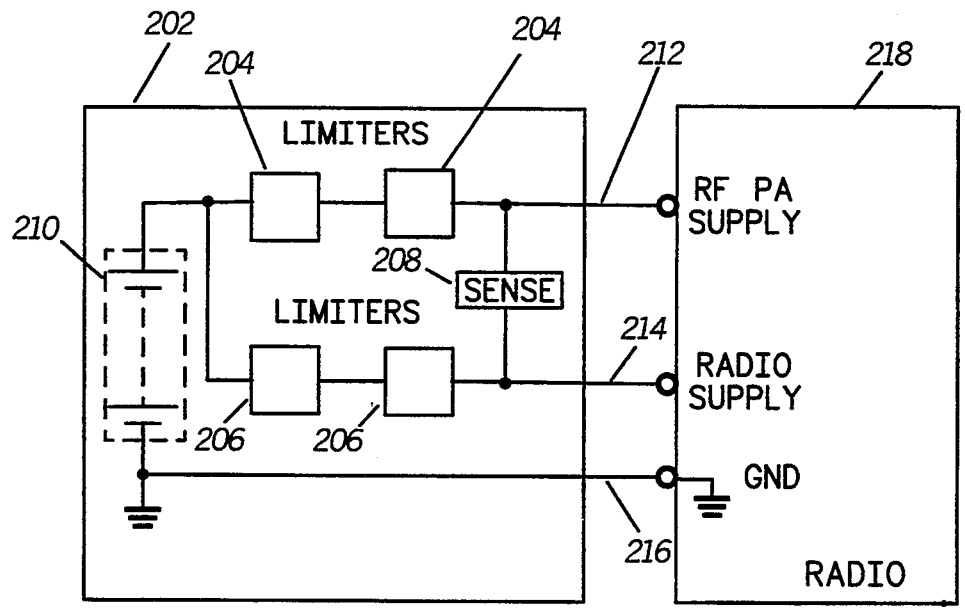
FIG. 2 is a block diagram of a battery and radio in accordance with the present invention.

Referring now to the drawings and in particular to FIG. 2, there is shown a dual output battery and radio 200. The battery includes a battery housing 202 which encloses a battery pack 210. Battery pack 210 includes a plurality of rechargeable nickel-cadmium battery cells connected in series. Connected to the positive terminal of battery pack in parallel, are a first and second limiting means such as a set of redundant voltage/current limiting circuits 204 and 206.

The first redundant limiting circuit 204, provides for a first limited battery output 212, while the second redundant limiting circuit 204 provides for a second limited battery output 214. In the preferred embodiment, the first limited battery output 212 is electrically connected to the R.F. power amplifier section of radio 218 and to other high current consuming circuits. The first output 212 preferably provides for a higher current and voltage level settings, given the fact that the R.F. Power amplifier section draws the most amount of power of any of the other circuits in radio 218 when it is in operation. The second limited output 214, is connected to the remaining electrical circuits of radio 218, which include all of the radio frequency and control circuits (low current consumption circuits) associated with a typical two-way radio. The final output provided by the battery is the ground potential output 216 which is coupled to the radio's ground potential (usually the radio chassis). Radio 218 includes both a conventional transmitter and receiver circuits as known in the art.

Coupled between the first and second (204 and 206) redundant limiting circuits at the output side, is a fault detection means (sense means) 208. The fault detection circuit 208 interrupts one or more of the battery outputs in the event a fault condition (e.g., a short circuit in radio 218, etc.) occurs at one or more of the battery outputs 212 and 214. The operation of the fault detection means 208 will be discussed in detail below.

Figure 3:
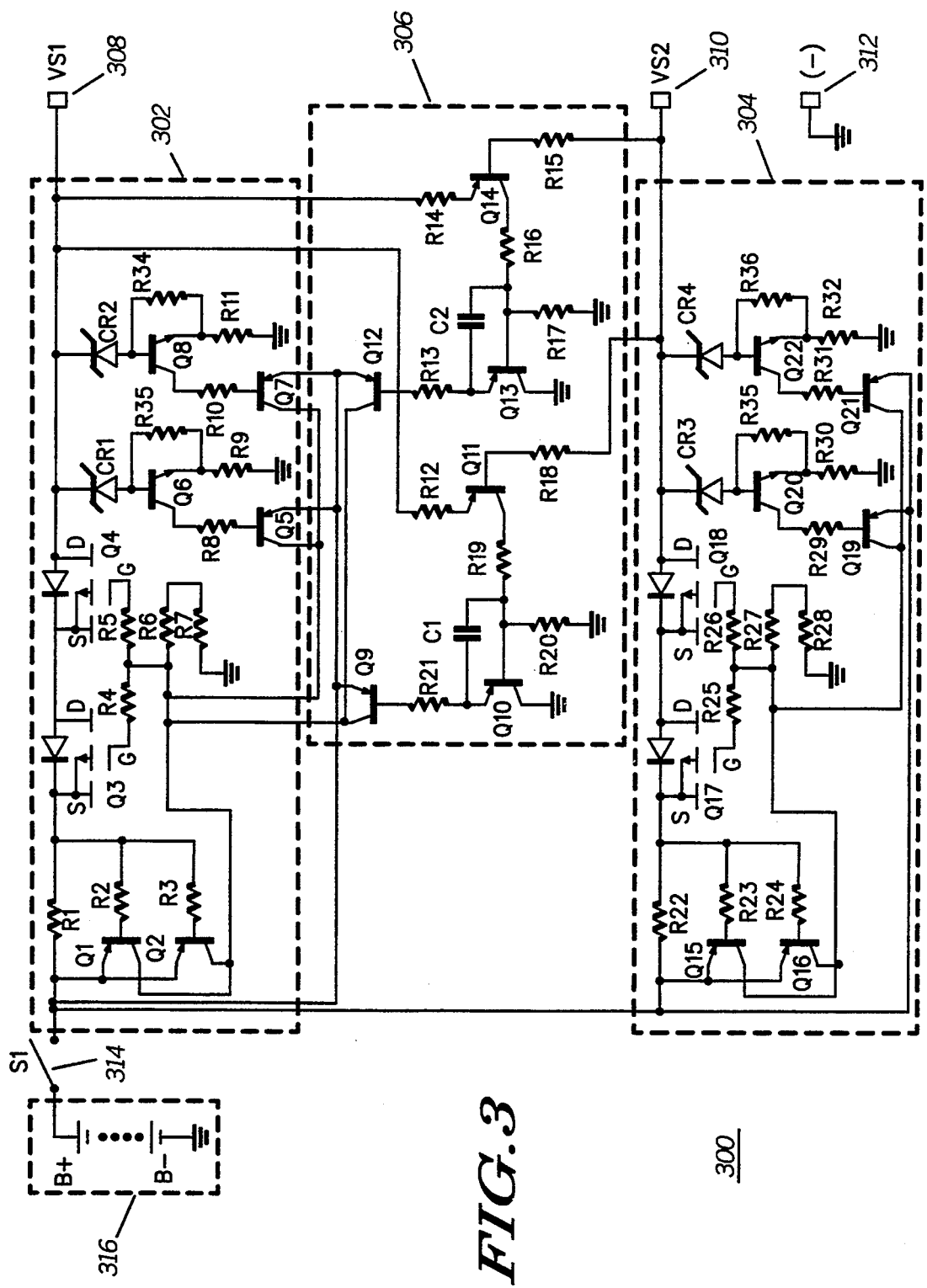
FIG. 3 is an electrical schematic of the battery of FIG. 2.

In FIG. 3, an electrical schematic of battery of FIG. 2 is shown. Battery 300, is composed of three major blocks, two redundant current/voltage limiter circuits 302 and 304, and a fault monitoring circuit 306. Each of the three major blocks 302, 304 and 306, include redundant elements (electronic components) for added safety of operation in hazardous environments. The redundancy allows for battery 300 to continue to provide fault monitoring and limiting capabilities, in the event an electrical component should happen to fail in the battery. The typical operation of the circuits will be explained below. Note that the redundant components will be shown in italics after any of the discussions, given that the redundant component has the same operational characteristics as the primary component.

Preferably, first limiter circuit 302 provides for a high current and voltage output (VS1) 308, while second limiter circuit 304 provides for a lower current and voltage output (VS2) 310. The redundant fault monitoring (detection)circuit 306 provides two major functions to battery 300. The first major function provided by fault monitoring circuit 306, is that it interrupts (shuts off) the VS1 output (high current supply) 308 in the event that a fault shorting outputs VS1 308 and VS2 310 together occurs. Secondly, fault monitoring circuit 306 shuts off output VS1 308, in the event that output VS1 308 remains in a current limited state for an extended period of time. The predetermined length of time the fault monitoring circuit 306 will allow the VS1 output 308 to remain in a current limiting condition prior to interrupting (shutting off) the battery output, is determined by the combination of capacitor C2 (C1) and resistor R17 (R20). This prevents excessive heating of current limiting Field-effect transistors (FET's) Q3 and Q4 in the high current output side of battery 300. This interruption is not necessary in the preferred embodiment for FET's Q17 and Q18 in circuit 304, as the limiting current setting for output VS2 310 is set lower than that of output VS1 308 and thereby, very limited heat build up is generated at circuit 304.

The theory of operation for first and second limiter circuits 302 and 304 respectively, will now be discussed. The gate terminals of transistors Q3 and Q4, of first limiter circuit 302, are pulled "low" (towards ground potential) by a series pair of resistors R6 and R7. This allows for transistors Q3 and Q4 to be in the saturated ("on") state. Current supplied by output VS1 308 must pass through resistor R1, which creates a voltage drop across R1 which is proportional to the current sourced by output VS1 308. When this voltage becomes large enough to forward bias the base-emitter junction of transistor Q1 (or redundant transistor Q2), the voltages at the gate terminals of transistors Q3 and Q4 will be pulled up, resulting in an increase in channel resistance in transistors Q3 and Q4, which limits the current output of output VS1 308. This in turn results in the conduction of transistor Q1 (or Q2). Thus, the current limit setting is determined by the value selected for resistor R1 or resistor R22 for circuit 304.

The voltage limiting of circuit 302 occurs when voltage at output VS1 308 is sufficient to cause current to flow through diode CR1 (or CR2 if utilizing the redundant circuit)into the base of transistor Q6 (Q8 of the redundant circuit). Transistor Q5 (or redundant transistor Q7) will then go into conduction which pulls the voltage at the gate terminal of transistor Q3 and Q4 high. This limits the voltage at output VS1 308. The voltage limit setting is determined by the choice of diode CR1 (CR2 in the redundant circuit).

The second voltage/current limiter circuit 304 operation is identical to the above circuit description, except for the choice of current and voltage limit settings. The voltage setting is decided by the choice of diode CR3 (redundant diode CR4) and the current limiting setting is decided by the value chosen for resistor R22. In second limiting circuit 304, the current limiting threshold is preferably set at a lower value in the preferred embodiment, since it is providing current for a portion of radio 218 which consumes a minimal amount of current (typically under 250 milliamps).

In the preferred embodiment (under normal conditions), the voltage at output VS1 308 is greater than that at output VS2 due to the choice of voltage/current limit settings. As such, base current flows in to transistor Q14 (Q11 of the redundant circuit) of fault detection circuit 306 which prevents conduction of transistors Q13 and Q12 (transistors Q10 and Q9, respectively of the redundant circuit). As long as transistor Q12 (Q9)is not conducting, the fault monitor circuit 306 does not influence the operation of the first current/voltage limiter circuit 302.

Any condition that results in the reduction of output VS1 308 or increase of output VS2 310 such that $[VS1 - VS2] < V_{BE}$ (approximately 0.6 volts) results in loss of base current to transistor Q11 (Q14 in the redundant circuit). This in turn causes conduction in transistor Q10 (Q13) and transistor Q9 (Q12). When transistor Q9 (Q12) conducts, the gate terminals of transistors Q3 and Q4 are pulled up, cutting off supply to output 308. Output VS1 308 will remain shut off until the battery is removed from the radio (not shown) which causes switch S1 314 to open and thereby allows for the circuits to reset. In order to reset switch 314, the radio user must place back the battery on the radio 218 after the short which caused the interruption has been resolved. Switch 134 can be a conventional plunger type of switch which is normally open, and which becomes closed upon the plunger being depressed (battery being placed on the radio). Capacitor C2 (C1) causes the fault monitor circuit 306 to ignore transient dips in current or voltage which may occur in output VS1 308 which would otherwise cause the output(s)to be interrupted. FETs Q3, Q4, Q17 and Q18 are preferably P-channel enhancement mode TMOS field-effect transistors. Finally, battery 300 includes a third ground potential output 312 for coupling to radio 218.

Although the preferred embodiment has been limited to a specific configuration, as described by the preferred embodiment, those skilled in the art can realize that many variations to the above battery circuit can be designed for. For example, more than two outputs can be provided by battery 300 as well as different current and voltage limiting criteria's can be set.

In summary, the present invention provides for a battery 300 for use with a portable electronic device such as a two-way portable radio 218 which can provide for fault monitoring capability. The battery 300 comprises two voltage/current limited outputs 308 and 310 and a fault monitoring circuit 306 coupled to a battery pack 316 all inside of the battery housing. The fault monitoring circuit 306 protects the radio in the case both outputs VS1 and VS2 become shorted together, or in the event one or more of the outputs remains current limited for a predetermined period of time, due to a fault in the radio or elsewhere. The invention allows for a radio and battery combination which can bypass the spacing and maximum voltage/current limits imposed by the testing agencies in order to be approved for intrinsic safety approval. Battery 300 guarantees that if any fault occurs at either of the battery outputs 308 and 310, the appropriate output(s) will be interrupted (shut off). The invention thereby allows for high powered radios which have not ordinarily been able to meet intrinsic safety levels, to now be able to achieve those approvals. Furthermore, the added redundancy of the circuits provides for an extra measure of safety for radios operating in very dangerous environments (e.g., gaseous, ignitable, etc.).

What is claimed is:

1. A portable rechargeable battery, comprising:
   a battery housing;
   a battery pack located inside of the battery housing;
      a high-power limiting means coupled to the battery pack for providing a high-power limited battery output;
      a low-power limiting means coupled to the battery pack for providing a low-power limited battery output; and
   a fault detection means coupled to the high-power and low-power battery outputs for interrupting the high-power limited battery output in the event a fault condition occurs which electrically shorts the high-power and low-power limited battery outputs together or which causes the high-power limited battery output to be under a current limited condition for over a predetermined period of time.

2. The portable rechargeable battery of claim 1, wherein the high-power and low-power limiting means provide both voltage and current limiting.

3. The portable rechargeable battery as defined in claim 1, wherein both the high-power and low-power limiting means each comprise redundant voltage and current limiting circuits.

4. A radio, comprising:
   a high-power consumption power amplifier section and a low-power consumption section; and
   a portable radio battery coupled to both the high-power consumption power amplifier section and the low-power consumption section, comprising:
      a battery housing;
      a battery pack located inside of the battery housing;
      a high-power limiting means coupled to the battery pack for providing a high-power limited battery output to the high-power consumption power amplifier section;
      a low-power limiting means coupled to the battery pack for providing a low-power limited battery output to the low-power consumption section; and
      a fault detection means coupled to the high-power and low-power battery outputs for interrupting the high-power limited battery output in the event a fault condition occurs which electrically shorts the high-power and low-power limited battery outputs together or which causes the high-power limited battery output to be under a current limited condition for over a predetermined period of time.

5. The portable rechargeable battery as defined in claim 4, wherein both the high-power and low-power limiting means each comprise redundant voltage and current limiting circuits.

* * * * *